United States Patent [19]

Perretta

[11] 4,384,755
[45] May 24, 1983

[54] ELECTRICAL HARNESS INTERFACE SYSTEM

[75] Inventor: Frederick A. Perretta, Trumbull, Conn.

[73] Assignee: The United States of America as represented by the Secretary of the Army, Alexandria, Va.

[21] Appl. No.: 230,769

[22] Filed: Feb. 2, 1981

[51] Int. Cl.³ ......................................... H01R 29/00
[52] U.S. Cl. .................................. 339/18 R; 361/410
[58] Field of Search .............. 339/18 R, 18 C, 18 B, 339/18 P, 19, 17 R, 17 C, 17 LM, 17 M; 361/409, 410

[56] References Cited

U.S. PATENT DOCUMENTS 2,416,285  2/1947  Buckingham et al. .......... 339/193 R
2,936,406  5/1960  Du Val, Jr. et al. ............ 339/18 C

FOREIGN PATENT DOCUMENTS 223402  10/1924  United Kingdom ............. 339/18 P
232450   4/1925  United Kingdom ............. 339/18 P
1032198  6/1966  United Kingdom ............. 361/410

*Primary Examiner*—Neil Abrams
*Attorney, Agent, or Firm*—Nathan Edelberg; Robert P. Gibson; Norman L. Wilson, Jr.

[57] ABSTRACT

An electrical harness interface system including a circuit board (either rigid or flexible) having one or more electronic modules adapted to be removably secured thereto with each of the modules having a plurality of connectors. An input/output connector and a matrix connector are also provided on the circuit board. The circuit board further includes a plurality of electrical conductors (or traces) interconnecting the electronic modules, the matrix connector, and the input/output connector. The system permits one or more of the electronic modules to be removed and to be replaced with another electronic module having a different electrical function (or logic) and requiring a different electrical connection to the conductors in the circuit board and/or to the input/output connector. This system comprises a plurality of spare connectors for each of the electronic modules and a plurality of spare electrical conductors in the circuit board. A replacement matrix connector is provided having a different connection arrangement therein whereby upon replacing one or more of the electrical modules and, upon removing the original matrix connector, and, upon installing the replacement matrix connector, the other electronic modules may be readily electrically connected to any of the modules or to the input/output connector via the conductors, spare connectors, spare conductors, and replacement matrix connector.

1 Claim, 3 Drawing Figures

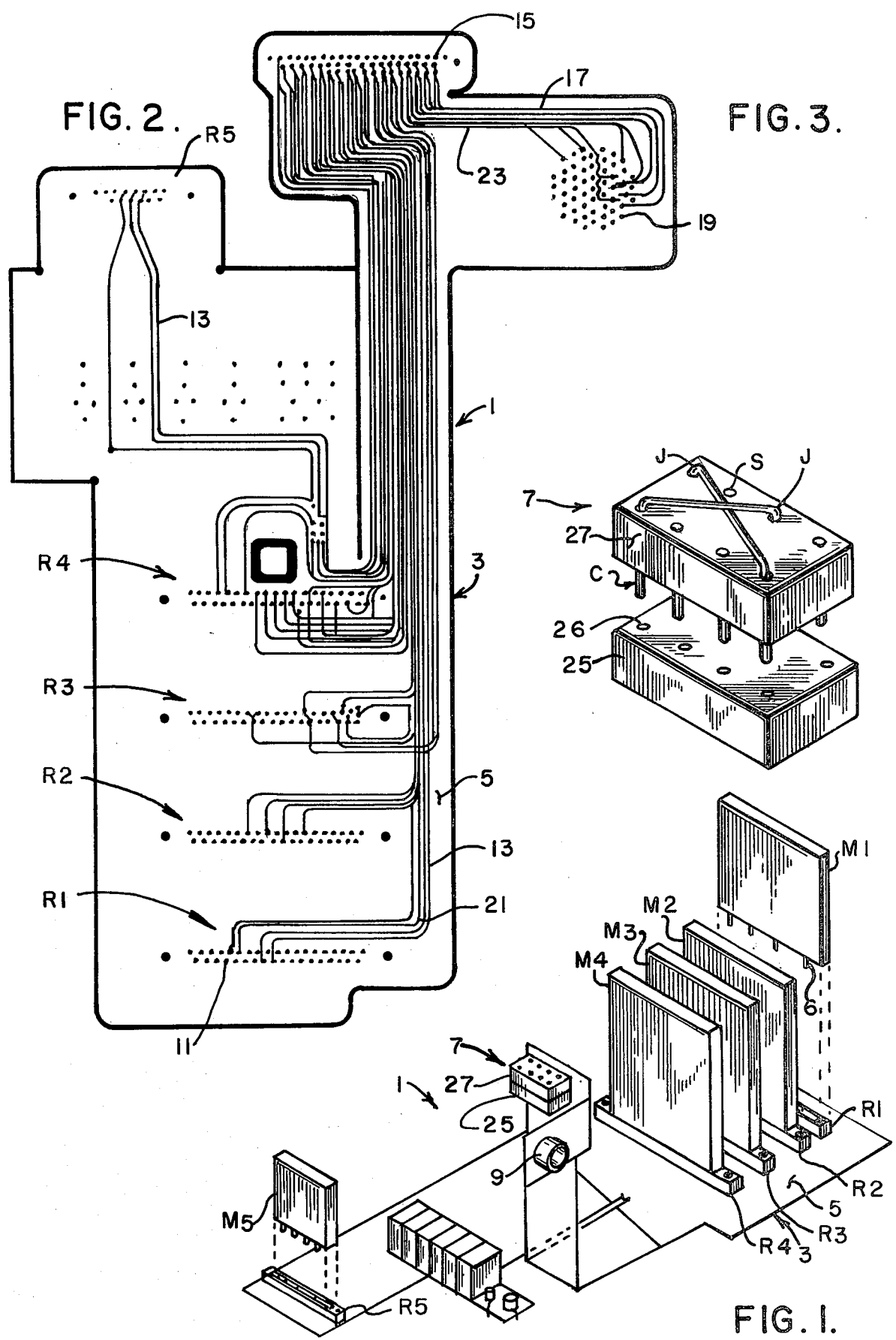

ELECTRICAL HARNESS INTERFACE SYSTEM

BACKGROUND OF THE INVENTION

This invention relates to an electrical harness interface system, and, more particularly, to such an harness interface system in which removable electronic modules carried thereon may be removed and replaced with another electronic module having a different electronic logic or function and requiring a different electrical hookup to other modules in the system or to the input/output terminal of the system without the necessity of removing the electrical harness from its application.

In certain avionic and aircraft electronic control systems, an electrical harness is provided in the aircraft for interconnecting various electronic components or for connecting the electronics to suitable controls and readout devices in the cockpit. In a typical state-of-the-art aircraft electrical system, such as the stabilator amplifier system installed in the Black Hawk helicopter manufactured by Sikorsky Aircraft, a division of United Technologies, for the U.S. Army, the system includes a flexible harness or circuit board mounted in a desired location within the aircraft. The flexible harness includes a plurality of receptacles for removably receiving electronic modules which may be plugged into or removed therefrom. Each of these modules includes solid state electronic circuitry and logic therein for performing a desired function. Typically, the harness also includes an input/output connector for connecting the various modules either to the cockpit or to other apparatus in the aircraft (e.g., to control actuators or the like).

Utilizing conventional wiring harness construction, it is necessary to remove the entire stabilator amplifier system from the aircraft and send it to a suitable maintainence or repair depot so as to incorporate new circuitry and/or additional inputs to existing circuitry. This requires that another harness must be installed in the aircraft in place of the harness removed and this installation nessecitates a complete dynamic checkout of the circuitry together with continuity checks. Additionally, operational checks of the circuitry involved in the replacement of the harness is required. Not only are these checkout procedures time consuming and costly, but oftentimes the removal of the entire harness leads to breaks in the conductors or traces in the harness thus again requiring replacement of the harness.

It will be appreciated, however, that upon changing the logic or electronic function of one of the removable electronic modules, a different arrangement of connectors in the harness may be required so as to interconnect the new electronic modules to other electronic modules provided on the harness.

SUMMARY OF THE INVENTION

Among the several objects and features of this invention may be noted the provision of an electrical harness interface system which, when installed in its application (i.e., in an aircraft or the like), may have one or more electronic modules removed from the harness and replaced with other electronic modules having different connector requirements without requiring that the harness be removed from its application so as to provide additional conductors for the different connector requirements;

The provision of such an electrical harness interface system in which a wide variety of unknown connector requirements can be provided for;

The provision of such an electrical harness interface system which, when one of the electronic modules thereof is changed, does not require costly and time consuming dynamic checkouts to be performed; and The provision of such an electrical harness interface system which is of rugged construction, which is lightweight, and which is reliable in operation.

Other objects and features of this invention will be in part apparent and in part pointed out hereinafter.

Briefly stated, this invention relates to an electrical circuit having one or more electronic modules, each of these electronic modules having a plurality of connectors thereon. The electric circuit further comprises an input/output connector, a matrix connector, and a plurality of electrical conductors interconnecting the electronic modules and the matrix connector and interconnecting the matrix connector and the input/output connector. The electronic modules perform predetermined electronic functions and are capable of being connected to or disconnected from the conductors as a unit. The matrix connector connects a predetermined conductor of a predetermined electronic module to another predetermined conductor which in turn may be connected to any desired electronic module or to the input/output connector. Specifically, the improvement of this invention comprises means for permitting one or more of the electronic modules to be removed and to be replaced with another electronic module having a different electronic function and requiring a different electrical connection to the conductors. This last said means comprises a plurality of spare conductors for each of the electronic modules extending from the electronic module to the matrix connector and a replacement matrix connector having a different electrical connection arrangement therein whereby upon replacing one or more of the electronic modules with another electronic module and upon removing the matrix connector and installing the replacement matrix connector, the other electronic modules may be readily electrically connected to any of the other electronic modules or to the input/output connector by utilizing preselected conductors, spare conductors, and the desired electrical connections within the replacement connector.

BRIEF DESCRIPTION OF THE DRAWINGS

FIG. 1 is a perspective view of an electrical harness interface system of the present invention including a flexible wiring harness, a plurality of electronic modules adapted to be removably electrically connected to the flexible harness, a matrix connector, and an input/output connector;

FIG. 2 is, on an enlarged scale, a back plan view of the flexible harness shown in FIG. 1 illustrating a plurality of conductors or electrical traces interconnecting the receptacles provided on the flexible harness for receiving respective electronic modules and the receptacle for the matrix connector and the receptacle for the input/output connector; and FIG. 3 is an enlarged exploded view of the matrix connector illustrating the matrix's connector base, the intermediate matrix connector section having male connector pins thereon adapted to be received in female connector receptacles provided in the matrix connector base and having connector sockets for having a predetermined arrangement of jumper wires electrically connected thereto.

Corresponding reference characters indicate corresponding parts throughout the several views of the drawings.

DESCRIPTION OF A PREFERRED EMBODIMENT

Referring now to the drawings, the electrical or electronic circuit of the present invention is indicated in its entirety by reference character 1. The electrical circuit comprises a circuit board 3 which, as shown in FIGS. 1 and 2 herein, is preferably (but not necessarily) a flexible wiring harness or the like. The flexible wiring harness 3 includes a substrate 5 of suitable synthetic resin electrical insulation material. On one face of the substrate (on its top as shown in FIG. 1) a plurality of electrical receptacles R1-R5 is provided into which a corresponding plurality of electrical or electronic modules, as indicated generally at M1-M5, may be removably electrically inserted (i.e., plugged into the receptacles). It will be understood that electronic modules M1-M5 may have enclosed therewithin a variety of electronic components arranged in any desired configuration to perform a predetermined electrical or electronic function. It will be understood by those skilled in the art that it is not necessary in the context of this invention, to describe in any detail the electronic components included with the electronic modules. Each of the electronic modules, however, has a plurality of connector pins which electrically engage contacts (not shown) provided within their respective receptacles R1-R5 when the modules are plugged into their receptacles.

Electrical circuit 1 further includes a matrix connector, as generally indicated at 7, on the substrate and an input/output female connector 9.

As best shown in FIG. 2, substrate 5 is provided with a plurality of connector pin holes 11 therein at the location of each of the receptacles R1-R5 in electrical contact with the contacts (not shown) within recepta- cles R1-R5. Further, circuit board 3 includes a plurality of electrical conductors or traces 13 which extend between selected connector pin holes 11 to corresponding connector pin holes 15 for matrix connector 7. Additionally, other conductors 17 are provided between other selected connector pin holes 15 from the matrix connector extending to other connector pin holes 19 for input/output connector 9. Still further, spare conductors or traces 21 are provided between each of the receptacles R1-R5 and the matrix connector and still other spare conductors or traces 23 are provided between the matrix connector and the input/output connector for purposes as will appear hereinafter. It will be understood, however, that on the initial application of electrical circuit 1, these spare conductors are not required to interconnect the various electronic modules, the input/output connector, and the matrix connector. That is, these spare conductors may not necessarily be required for the initial application of the electronic circuit 1.

Matrix connector assembly 7 includes a matrix receptacle or base 25 secured to substrate 5 and permanently interconnected to all of the conductors or traces 13, 17, 21, and 23 extending from receptacles R1-R5 and the matrix connector and extending between the matrix connector and input/output connector 9. As best shown in FIG. 3, the matrix connector base 25 has a plurality of female electrical receptacles 26 therein. The matrix connector assembly 7 further comprises a connector body 27 having a plurality of male connector pins, as generally indicated at C, corresponding to the female receptacle openings 26 in matrix connector base 25. It will be understood that these connector pins C may be plugged into the receptacle openings 26 for making electrical contact therewith. Further, matrix member 27 has a plurality of sockets S on the side opposite thereof from connectors C. Sockets S are electrically interconnected connectors C by means of jumper wires J for making selective electrical connection between any selected combination of the sockets S and connector pins C, as required for operation of electrical circuit 1. It will be understood that for purposes of illustration and clarity, only a few receptacle openings, connectors and jumpers have been shown in matrix connector assembly 7.

In the event it is determined that a change in the logic configuration of one of the electronic modules M1-M5 is required such that either a different connector pin 6 arrangement for the electronic module, or if it is required that the electronic module be connected in a different manner to another electronic module or to the input/output connector, the electrical circuit 1 of this invention permits the ready exchange of an already existing electronic module with a modified electronic module merely by removing one electronic module from its corresponding receptacle, by plugging in the modified electronic module, and by replacing only the connector member 27 of matrix connector assembly 7 with another connector member (referred to as a replacement matrix connector) having jumper wires J connected to the sockets S and the terminals C thereof in a preselected fashion.

The electrical circuit of the present invention has particular application in aircraft wiring harnesses and electronic circuitry. For example, electrical circuit 1 may constitute a stabilator amplifier harness in an aircraft or the like. It will be understood that circuit board 3 is mounted in a desired location (i.e., within a box not shown) in the aircraft. A wire bundle (also not shown) interconnects electrical circuit 1 with other electrical apparatus within the aircraft, such as to a power supply, an onboard computer, or to controls or suitable displays in the cockpit. If it is desirable to incorporate a modification in the electronic logic or circuitry of electrical circuit 1, the circuit of this invention permits such a change to be readily made without having to physically remove the entire electrical circuit from the aircraft and to install another electrical circuit already having the modification incorporated therein. More specifically, the modification may be accomplished in electrical circuit 1 merely by removing one or more of the electronic modules M1-M5 and by replacing certain of these electronic modules with replacement modules already having the logic changes or component changes incorporated therein. These replacement modules are of identical outside dimensions with the original modules and include a similar arrangement of connector pins adapted to be received in their respective receptacles R1-R5 provided on circuit board 3. For example, an old electronic module M1 may be removed or unplugged from its respective receptacle R1 and the replacement module having the new electronic logic and/or components incorporated therein may be plugged into receptacle R1. As is often the case, however, upon incorporating a logic or component change, it is necessary to have a different arrangement of connectors for the replacement module.

In accordance with the present invention, spare conductors 21 and 23 may be utilized to accommodate the requirement of a different conductor arrangement for the replacement electronic modules. If, for example, a replacement module M1' had a requirement for an additional conductor and if the replacement module M1' was further required to be interconnected to an already existing connector for electronic module M2, one of the spare conductors 21 extending from connector pin holes 11 for receptacle R1 to the receptacle holes 15 in matrix connector 7 may be utilized. Further in accordance with this invention, the original intermediate connector member 27 of the matrix connector is removed, and a replacement intermediate connector member 27' is inserted in the matrix connector in its place. This replacement intermediate connector member has appropriate jumper wires J prewired therein to sockets S for interconnecting the spare conductor 21 now being utilized by the replacement module M1' to another conductor terminal which in turn is connected to another spare conductor member 21 leading to the desired spare conductor pin in receptacle R2. Likewise, appropriate spare conductors 23 may be utilized in any desired manner to interconnect the replacement electronic modules with the input/output connector as the logic changes and function of the circuit dictate.

In view of the above, it will be seen that the objects of this invention are achieved and other advantageous results obtained.

As various changes could be made in the above constructions or without departing from the scope of the invention, it is intended that all matter contained in the above description are shown in the accompanying drawings shall be interpreted as lustrative and not in a limiting sense.

What is claimed is:

1. In an aircraft electronic control system with an electrical circuit board having one or more electronic modules, each of said modules having a plurality of electrical terminals, an input/output connector also having a plurality of electrical terminals, a matrix connector having a plurality of terminals, and a plurality of electrical conductors interconnecting the electrical terminals of said electronic modules with the electrical terminals of said matrix connector and also interconnecting the electrical terminals of said matrix connector with the electrical terminals of said input/output connector, said modules performing a predetermined electronic function and being capable of being connected to or disconnected from said conductors as a unit, said matrix connector connecting a predetermined conductor from a predetermined module to another predetermined conductor which in turn may be connected to any desired module or to said input/output connector, the improvement for changing the electronic function without removing the circuit board from the control system for said change, eliminating subsequent dynamic testing comprising: means for permitting one or more of said modules to be removed from said circuit and to be replaced with another module having different electronic functions or components therein and requiring a different connection pattern to any of said modules and/or to said input/output connector, said means comprising a plurality of spare conductors not initially required with at least one of the spare conductors being provided for each of said modules, means for permitting said matrix connector to be removed from said circuit and replaced with another matrix connector such that one or more of said modules is connected to a specific one or more of said spare connectors, said spare conductors extending from the electrical connection of each of said modules to the electrical connection of said matrix connector and said spare conductors further extending from the electrical connectors of said matrix connector to the electrical connectors of said input/output connector, each said replacement matrix connector having a different electrical connection arrangement utilizing a selected arrangement of said conductors and spare conductors thus permitting said other modules to be interconnected to the other components of the circuit.

* * * * *